United States Patent
Lee

(10) Patent No.: US 8,884,692 B2
(45) Date of Patent: Nov. 11, 2014

(54) MULTI-BAND POWER AMPLIFIER

(75) Inventor: Jong Soo Lee, Gwangju (KR)

(73) Assignee: Gwangju Institute of Science and Technology, Buk-gu, Gwangju (KR)

( * ) Notice: Subject to any disclaimer, the term of this patent is extended or adjusted under 35 U.S.C. 154(b) by 22 days.

(21) Appl. No.: 13/519,715

(22) PCT Filed: Feb. 5, 2010

(86) PCT No.: PCT/KR2010/000732
§ 371 (c)(1),
(2), (4) Date: Jun. 28, 2012

(87) PCT Pub. No.: WO2011/081247
PCT Pub. Date: Jul. 7, 2011

(65) Prior Publication Data
US 2012/0286876 A1     Nov. 15, 2012

(30) Foreign Application Priority Data
Dec. 30, 2009   (KR) .................. 10-2009-0133675

(51) Int. Cl.
```
H03F 1/14      (2006.01)
H03F 3/72      (2006.01)
H03F 3/60      (2006.01)
H03F 1/56      (2006.01)
H03F 3/191     (2006.01)
```
(52) U.S. Cl.
CPC .......... *H03F 3/191* (2013.01); *H03F 3/72* (2013.01); *H03F 3/602* (2013.01); *H03F 2200/111* (2013.01); *H03F 2203/7209* (2013.01); *H03F 2200/387* (2013.01); *H03F 2200/378* (2013.01); *H03F 2200/423* (2013.01); *H03F 1/565* (2013.01); *H03F 2200/417* (2013.01); *H03F 2200/421* (2013.01)
USPC .............................. 330/51; 330/124 R

(58) Field of Classification Search
CPC ............................................ H03F 3/68
USPC ................. 330/51, 124 R, 295, 302, 126
See application file for complete search history.

(56) References Cited

U.S. PATENT DOCUMENTS

| | | | |
|---|---|---|---|
| 5,548,246 A * | 8/1996 | Yamamoto et al. | 330/51 |
| 6,970,040 B1 * | 11/2005 | Dening | 330/126 |
| 7,295,065 B2 * | 11/2007 | Shah et al. | 330/124 R |
| 7,330,071 B1 * | 2/2008 | Dening et al. | 330/127 |
| 7,589,589 B2 * | 9/2009 | Kusunoki | 330/51 |
| 7,936,213 B2 * | 5/2011 | Shin et al. | 330/124 R |
| 2003/0025555 A1 | 2/2003 | Ohnishi et al. | |
| 2004/0113698 A1 * | 6/2004 | Kim et al. | 330/295 |

(Continued)

FOREIGN PATENT DOCUMENTS

| | | |
|---|---|---|
| EP | 1796203 A1 | 6/2007 |
| JP | 2000502864 A | 3/2000 |

(Continued)

*Primary Examiner* — Henry Choe
(74) *Attorney, Agent, or Firm* — Nath, Goldberg & Meyer; Jerald L. Meyer; Stanley N. Protigal

(57) ABSTRACT

Disclosed is a multi-band power amplifier capable of operating at multiple frequency bands. The multi-band power amplifier includes: a power amplification unit which amplifies an input signal; a matching network circuit which provides impedance matching between the power amplification unit and a load; and an auxiliary amplification unit which additionally supplies a certain magnitude of electric current to the load.

12 Claims, 6 Drawing Sheets

(56) References Cited

U.S. PATENT DOCUMENTS

| | | |
|---|---|---|
| 2006/0028269 A1 | 2/2006 | Chen |
| 2008/0111630 A1* | 5/2008 | Harima .................. 330/296 |
| 2008/0258821 A1 | 10/2008 | Zhou |
| 2009/0045877 A1* | 2/2009 | Wang et al. ............... 330/295 |

FOREIGN PATENT DOCUMENTS

| | | |
|---|---|---|
| JP | 20065000820 A | 1/2006 |
| JP | 2006148523 A | 6/2006 |
| JP | 2007522690 A | 8/2007 |
| JP | 2009130897 A | 6/2009 |
| JP | 2009153193 A | 7/2009 |
| JP | 2009543499 A | 12/2009 |
| KR | 20050011134 A | 1/2005 |
| KR | 200406471 Y1 | 1/2006 |
| KR | 1020060095377 A | 8/2006 |
| KR | 20070003391 A | 1/2007 |
| KR | 1020070020796 A | 2/2007 |
| KR | 1020070044669 A | 4/2007 |
| WO | 2007125895 A1 | 11/2007 |

* cited by examiner (a)

(b)

MULTI-BAND POWER AMPLIFIER

TECHNICAL FIELD

The present invention relates to a power amplifier, and more particularly to a multi-band power amplifier capable of operating at multiple frequency bands.

BACKGROUND ART

The development of a mobile communication technology leads to use of various telecommunication schemes and different frequency bands are used according to countries, regions or telecommunication schemes. Thus, multi-band communication techniques for covering various frequency bands through a single chipset have received attention in recent years. In such multi-band communication techniques, however, a power amplifier has characteristics making it difficult to realize multi-band performance.

In the related art, separate power amplifiers for various frequency bands are used to support multi-band performance, causing an increase in circuit area and economic infeasibility, and this structure is configured to allow an input signal to pass through a switch between two power amplifiers, causing undesired power consumption.

DISCLOSURE

Technical Problem

The present invention is directed to providing a multi-band power amplifier capable of operating at multiple frequency bands while reducing circuit area.

Technical Solution

In accordance with an aspect of the present invention, a multi-band power amplifier includes: a power amplification unit which amplifies an input signal; a matching network circuit which provides impedance matching between the power amplification unit and a load; and an auxiliary amplification unit which additionally supplies a certain magnitude of electric current to the load.

The multi-band power amplifier may further include a transmission line which changes the magnitude and phase of electric current output from the auxiliary amplification unit.

The multi-band power amplifier may further include a switch which interrupts the electric current additionally supplied to the load.

The switch may be set to an OFF state at a first frequency and to an ON state at a second frequency. Here, impedances seen from the power amplification unit towards the load may be set to be the same at the first frequency and at the second frequency. Here, the electric current output from the auxiliary amplification unit may be set such that impedances seen from the power amplification unit towards the load are the same at the first frequency and at the second frequency. Here, the electric current output from the auxiliary amplification unit may be set according to a bias circuit of the auxiliary amplification unit.

In accordance with another aspect of the present invention, a multi-band power amplifier includes: a power amplification unit which amplifies an input signal; a matching network circuit which provides impedance matching between the power amplification unit and a load; an auxiliary amplification unit which additionally supplies a certain magnitude of electric current to the load; a transmission line which changes the magnitude and phase of electric current output from the auxiliary amplification unit; and a switch which interrupts the electric current additionally supplied to the load.

The switch may, be placed between the transmission line and an output stage of the power amplification unit.

The switch may be placed between the auxiliary amplification unit and the transmission line.

In accordance with a further aspect of the present invention, a multi-band power amplifier includes: a power amplification unit which amplifies an input signal; a matching network circuit which provides impedance matching between the power amplification unit and a load; an auxiliary amplification unit which additionally supplies a certain magnitude of electric current to the load; a band selection unit which selects an operating frequency band of the multi-band power amplifier; and a bias adjusting unit which adjusts the magnitude of electric current output from the auxiliary amplification unit according to the frequency band selected by the band selection unit.

The multi-band power amplifier may further include a transmission line which changes the magnitude and phase of electric current output from the auxiliary amplification unit.

The bias adjusting unit may adjust the magnitude of electric current output from the auxiliary amplification unit by adjusting a bias of the auxiliary amplification unit.

The multi-band power amplifier may further include a switch which interrupts the electric current additionally supplied to the load.

The band selection unit may generate a control signal to control the bias adjusting unit to adjust the magnitude of electric current output from the auxiliary amplification unit by adjusting a bias of the auxiliary amplification unit according to the selected frequency band.

The multi-band power amplifier may further include an impedance matching circuit and the band selection unit may generate a control signal to adjust an impedance of the impedance matching circuit according to the selected frequency band. Here, the impedance matching circuit includes a multistage switch and different impedance devices connected to respective stages of the multistage switch, and the control signal may adjust the impedance of the impedance matching circuit by controlling the multistage switch. Alternatively, the impedance matching circuit may include a variable capacitor and the control signal may adjust the impedance of the impedance matching circuit by controlling capacitance of the variable capacitor.

Advantageous Effects

According to the present invention, the multi-band power amplifier is capable of operating at various frequency bands and embodies multi-band performance through a single power amplification unit and an impedance matching circuit at an output stage thereof, thereby reducing circuit area.

BEST MODE

Figure 1:
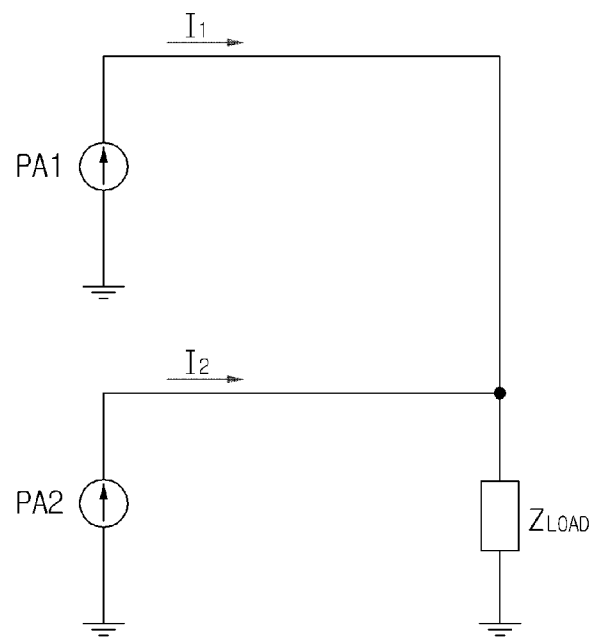
FIG. 1 is a circuit diagram illustrating a general principle of a multi-band power amplifier according to the present invention.

Exemplary embodiments of the present invention will now be described with reference to the accompanying drawings. Herein, like components will be denoted by like reference numerals throughout the specification and the drawings. Elaboration of functions or features apparent to a person having ordinary knowledge in the art will be omitted herein for clarity of description of the present invention.

FIG. 1 is a circuit diagram illustrating a general principle of a multi-band power amplifier according to the present invention.

Referring to FIG. 1, PA2 denotes a power amplification unit which amplifies an input signal, $Z_{LOAD}$ denotes load of the power amplification unit, and PA1 denotes an auxiliary amplification unit which additionally supplies electric current to $Z_{LOAD}$. In FIG. 1, an electric current $I_2$ is supplied from the power amplification unit to the load and an electric current $I_1$ is additionally supplied from the auxiliary amplification unit thereto. Then, a load $Z_{LOAD\_N}$ seen from the power amplification unit towards $Z_{LOAD}$ may be expressed by the following equation.

$$Z_{LOAD\_N} + Z_{LOAD}\left(1 + \frac{I_1}{I_2}\right) \qquad \langle\text{Equation 1}\rangle$$

Thus, a load line of PA2 is changed according to the magnitude and phase of the current $I_1$. In this point of view, when the magnitude and phase of the electric current $I_1$ from the auxiliary amplification unit is suitably selected for multi-band operation, $Z_{LOAD\_N}$ may be changed according to variation of operating frequency.

Figure 2:
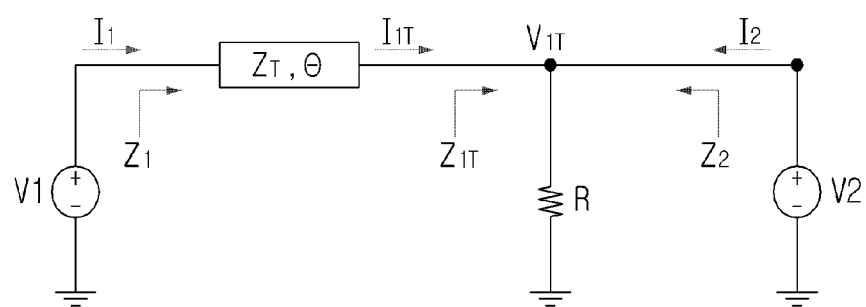
FIG. 2 is a detailed circuit diagram of the multi-band power amplifier according to the present invention.

FIG. 2 is a detailed circuit diagram of the multi-band power amplifier according to the present invention.

Referring to FIG. 2, $Z_{LOAD}$ of FIG. 1 is simplified to resistance R, and PA1 and PA2 representing current sources are converted to voltage sources $V_1$ and $V_2$, respectively. Further, in order to adjust the magnitude and phase of electric current supplied from the auxiliary amplification unit, a transmission line is connected to the voltage source $V_1$ in series. The transmission line has a characteristic impedance $Z_T$ and an electrical length $\theta$. Further, a load seen from $V_1$ will be denoted by $Z_1$, a load seen from the transmission line will be denoted by $Z_{1T}$, and a load seen from $V_2$ will be denoted by $Z_2$.

By ABCD matrix of the transmission line, relationships between $V_1$, $I_1$, $V_{1T}$, and $I_{1T}$ may be expressed by the following equation.

$$\begin{bmatrix} V_1 \\ I_1 \end{bmatrix} = \begin{bmatrix} \cos\theta & jZ_T\sin\theta \\ \dfrac{j\sin\theta}{Z_T} & \cos\theta \end{bmatrix}\begin{bmatrix} V_{1T} \\ I_{1T} \end{bmatrix} \qquad \langle\text{Equation 2}\rangle$$

Equation 2 may be expressed as follows.

$$V_1 = \cos\theta \cdot V_{1T} + jZ_T \cdot \sin\theta \cdot I_{1T} \qquad \langle\text{Equation 3}\rangle$$
$$I_1 = \frac{j\sin\theta}{Z_T}V_{1T} + \cos\theta \cdot I_{1T}$$

Then, from this equation, $V_{1T}$ and $I_{1T}$ may be obtained as follows.

$$V_{1T} = \frac{Z_T}{j\sin\theta}(I_1 - \cos\theta \cdot I_{1T}) \qquad \langle\text{Equation 4}\rangle$$
$$I_{1T} = \frac{Z_T\cos\theta - jZ_1\sin\theta}{Z_T}I_1$$

$Z_1$ may be obtained according to the characteristics of the transmission line as follows.

$$Z_1 = Z_T\frac{Z_{1T}\cos\theta + jZ_T\sin\theta}{Z_T\cos\theta - jZ_{1T}\sin\theta} \qquad \langle\text{Equation 5}\rangle$$

From Equations 4 and 5, $I_{1T}$ may be obtained as follows.

$$I_{1T} = \frac{Z_T}{Z_T\cos\theta + j\sin\theta}I_1 \qquad \langle\text{Equation 6}\rangle$$

From Equations 6 and 1, $Z_{1T}$ may be obtained as follows.

$$Z_{1T} = R\left(1 + \frac{I_2}{I_{1T}}\right) = \frac{1 + \left(\dfrac{I_2}{I_1}\right)\cos\theta}{\dfrac{1}{R} - \dfrac{j\sin\theta}{Z_T}\left(\dfrac{I_2}{I_1}\right)} \qquad \langle\text{Equation 7}\rangle$$

Then, $Z_2$ may be obtained as follows.

$$Z_2 = R\left(1 + \frac{I_{1T}}{I_2}\right) = \qquad \langle\text{Equation 8}\rangle$$
$$R\left\{1 + \left(\frac{I_2}{I_1}\right)\frac{Z_T}{Z_T\cos\theta + jR\sin\theta} - \frac{jR\sin\theta}{Z_T\cos\theta + jR\sin\theta}\right\}$$

From Equation 4, the following equation is established.

$$V_{1T} = \frac{Z_T}{j\sin\theta}(I_1 - \cos\theta \cdot I_{1T}) \qquad \langle\text{Equation 9}\rangle$$
$$= \frac{Z_TZ_{1T}}{Z_T\cos\theta + jZ_{1T}\sin\theta}I_1$$
$$= V_2$$

When substituting Equation 7 into Equation 9, $V_2$ is expressed as follows.

$$V_2 = \frac{Z_T(I_1 + \cos\theta \cdot I_2)}{\frac{Z_T}{R}\cos\theta + j\sin\theta} \quad \langle\text{Equation 10}\rangle$$

Further, when substituting Equation 7 into Equation 7, $Z_1$ is expressed as follows.

$$Z_1 = Z_T \frac{Z_{1T}\cos\theta + jZ_T\sin\theta}{Z_T\cos\theta + jZ_{1T}\sin\theta} \quad \langle\text{Equation 11}\rangle$$

$$= Z_T \frac{\cos\theta + \frac{jZ_T\sin\theta}{R} + \left(\frac{I_2}{I_1}\right)}{\frac{Z_T\cos\theta}{R} + j\sin\theta}$$

Therefore, $V_1$ is expressed as follows.

$$V_1 = Z_1 \cdot I_1 = \frac{Z_T I_1}{\frac{Z_T\cos\theta}{R} + j\sin\theta}\left(\cos\theta + \frac{j\sin\theta}{R} + \left(\frac{I_2}{I_1}\right)\right) \quad \langle\text{Equation 12}\rangle$$

Accordingly, when the characteristic impedance $Z_T$ of the transmission line is expressed as $Z_T = R \cdot \beta$ using the ratio $\beta$ to load resistance R, and the ratio of $I_2$ to $I_1$ is expressed by $I_2/I_1 = \alpha$, Equations 12, 10, 11, 8 and 7 are expressed using $\beta$ and $\alpha$ as follows.

$$V_1 = \frac{Z_T I_1}{\beta\cos\theta + j\sin\theta}(\cos\theta + j\beta\sin\theta + \alpha) \quad \langle\text{Equation 13}\rangle$$

$$V_2 = \frac{Z_T I_1(1 + \alpha\cos\theta)}{\beta\cos\theta + j\sin\theta} \quad \langle\text{Equation 14}\rangle$$

$$Z_1 = Z_T \frac{\cos\theta + j\beta\sin\theta + \alpha}{\beta\cos\theta + j\sin\theta} \quad \langle\text{Equation 15}\rangle$$

$$Z_2 = R\left\{1 + \frac{1}{\alpha}\frac{\beta}{\beta\cos\theta + j\sin\theta} - \frac{j\sin\theta}{\beta\cos\theta + j\sin\theta}\right\} \quad \langle\text{Equation 16}\rangle$$

$$Z_{1T} = Z_T \frac{1 + \alpha\cos\theta}{\beta - j\alpha\sin\theta} \quad \langle\text{Equation 17}\rangle$$

Equation 16 shows that the load line $Z_2$ of the power amplification unit is determined according to $\alpha$, $\beta$, and $\theta$. Thus, even when the operating frequency is changed, a constant load line is formed in the power amplification unit by adjusting $\alpha$, $\beta$, or $\theta$, that is, by adjusting the electric current of the auxiliary amplification unit and the characteristic impedance or electrical length of the transmission line, thereby realizing the multi-band power amplifier.

Figure 3:
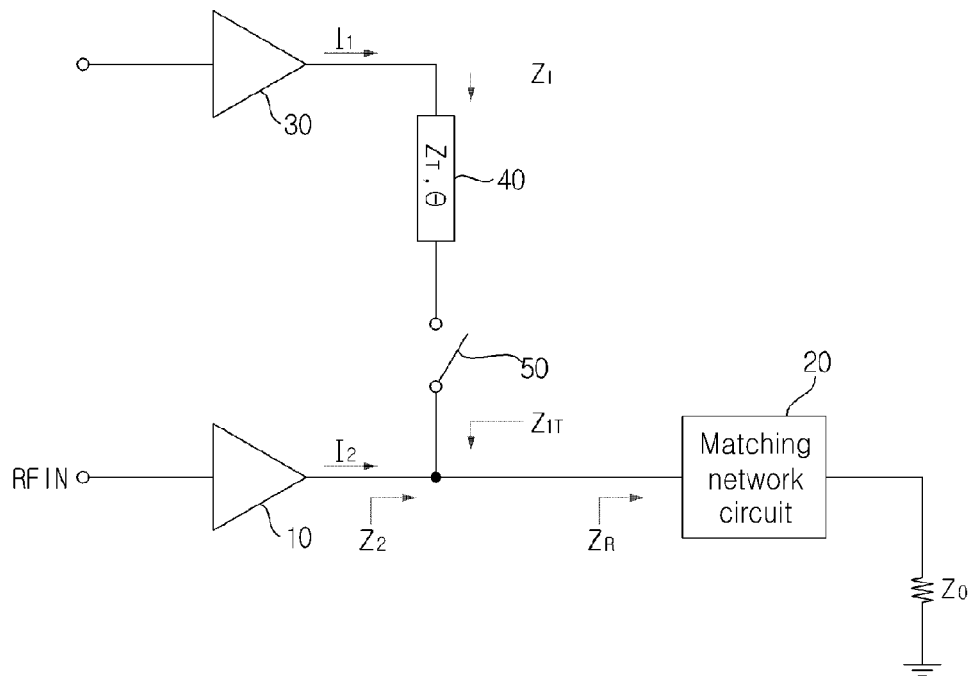
FIG. 3 is a circuit diagram of a multi-band power amplifier according to one embodiment of the present invention.

FIG. 3 is a circuit diagram of a multi-band power amplifier according to one embodiment of the present invention The multi-band power amplifier according to this embodiment includes a power amplification unit 10 which amplifies an input signal, a matching network circuit 20 which provides impedance matching between the power amplification unit 10 and a load $Z_0$, an auxiliary amplification unit 30 which additionally supplies a certain magnitude of electric current to the load $Z_0$, a transmission line 40 which changes the magnitude and phase of electric current output from the auxiliary amplification unit 30, and a switch 50 which is placed between the transmission line 40 and an output stage of the power amplification unit 10 and interrupts the electric current additionally supplied to the load $Z_0$.

Figure 4:
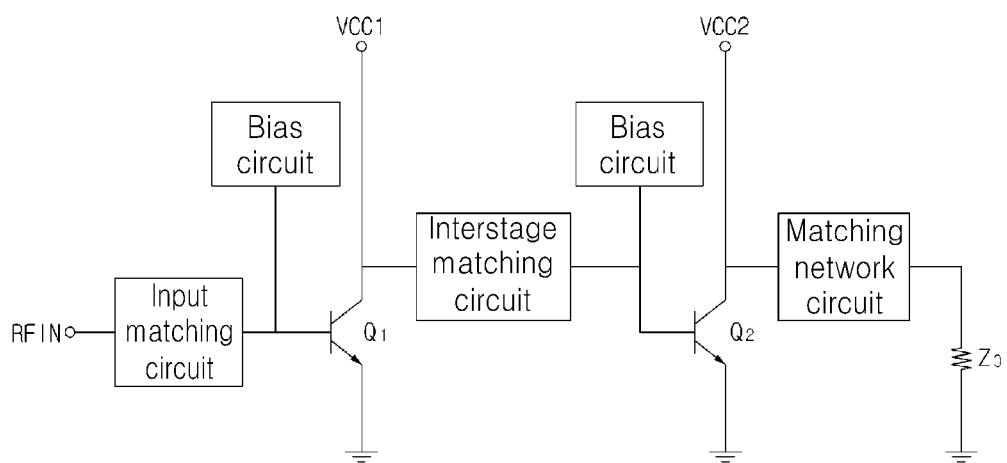
FIGS. 4 and 5 are circuit diagrams of a power amplification unit 10 and a matching network circuit 20 according to one embodiment of the present invention.
Figure 5:
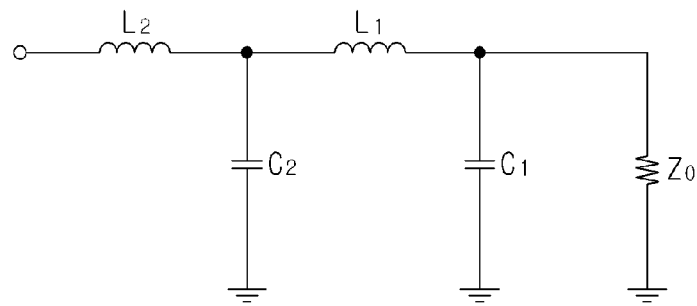

FIGS. 4 and 5 are circuit diagrams of the power amplification unit 10 and the matching network circuit 20 according to one embodiment of the invention. As shown therein, the power amplification unit 10 may be embodied by a two-stage amplification circuit having a bias circuit at each stage thereof, and the matching network circuit 20 may be embodied by a two-stage low-pass filter, without being limited thereto. Here, it should be understood that any typical amplification circuit and matching network circuit may be used. Further, the auxiliary amplification unit 30 may be a typical amplification circuit which includes a general bias circuit for determining output current.

Obviously, the load $Z_0$ typically has an impedance of 50Ω in FIG. 3, but may have any impedance. Further, although the switch 50 is illustrated as being placed between the transmission line 40 and the output stage of the power amplification unit 10 in FIG. 3, the switch 50 may be placed between the auxiliary amplification unit 30 and the transmission line 40 to interrupt the electric current additionally supplied to the load $Z_0$.

Referring to FIG. 3, the multi-band power amplifier according to this embodiment is operated by setting the switch 50 to an OFF state at a particular frequency $f_1$ and setting the switch 50 to an ON state at another particular frequency $f_2$. Here, the impedance $Z_2$ seen from the power amplification unit 10 towards the load may become the same at the frequencies $f_1$ and $f_2$ by suitably selecting the magnitude and phase of electric current additionally supplied to the load Z0 using the bias circuit of the auxiliary amplification unit 30 and the transmission line 40.

Let the impedance $Z_R$ seen from an input stage of the matching network circuit 20 towards the load be $Z_{R\_f1}=R'$ at the frequency $f_1$ and $Z_{R\_f2}=R$ at the frequency $f_2$. Then, when the switch 50 is in an OFF state at the frequency $f_1$, the impedance Z2 seen from the power amplification unit 10 towards the load becomes $Z_{2\_LOAD\_f1}=R'$.

Then, from Equation 16, when the switch 50 is in an ON state at the frequency $f_2$, the impedance $Z_{2(Z2\_LOAD\_f2)}$ seen from the power amplification unit 10 towards the load is adjusted to become $Z_{2\_LOAD\_f1}$ as expressed by the following equation, allowing the multi-band power amplifier 50 of this embodiment to operate at both frequencies $f_1$ and $f_2$ according to On/Off of the switch. Here, the real number part of $Z_{2\_LOAD\_f2}$ may be become the same as the real number part of $Z_{2\_LOAD\_f1}$.

$$Z_{2\_LOAD\_f2} = R\left\{1 + \frac{1}{\alpha}\frac{\beta}{\beta\cos\theta + j\sin\theta} - \frac{j\sin\theta}{\beta\cos\theta + j\sin\theta}\right\} \quad \langle\text{Equation 18}\rangle$$

$$= Z_{2\_LOAD\_f1}$$

$$= R'$$

In order to allow the power amplifier to operate at both frequencies $f_1$ and $f_2$ according to On/Off of the switch 50, $\alpha$, $\beta$ and $\theta$ are selected to satisfy this equation. Here, since $\beta$ and $\theta$ are predetermined according to the characteristic impedance and electrical length of the transmission line 40, $\alpha$ is suitably selected to determine the electric current $I_1$ output from the auxiliary amplification unit 30. Accordingly, by adjusting the current $I_1$, it is possible to adjust the operating frequency of the multi-band power amplifier when the switch 50 is in an ON state. The magnitude of the electric current $I_1$ may be adjusted using the bias circuit of the auxiliary amplification unit 30.

When $Z_0=50\Omega$ in FIG. 3, C1=2.6 pF, L1=1.84 nH, C2=9.2 pF and L2=0.52 nH in the matching network circuit of FIG. 5, $Z_{R\_f1}$, $Z_{R\_f2}$ and $Z_{2\_LOAD\_f1}$ are obtained as follows, when f1=1950 MHz and f2=835 MHz.

$$Z_{R\_f1}=R'=4$$

$$Z_{R\_f2}=R=6.26-j11.7$$

$$Z_{2\_LOAD\_f1}=R'=4 \qquad \text{<Equation 19>}$$

Thus, $Z_{2\_LOAD\_f2}$ must satisfy the following equation in order to allow the multi-band power amplifier to operate on the same load line at the frequency $f_2$.

$$Z_{2\_LOAD\_f2} = R\left\{1 + \frac{1}{\alpha}\frac{\beta}{\beta\cos\theta + j\sin\theta} - \frac{j\sin\theta}{\beta\cos\theta + j\sin\theta}\right\} \qquad \text{<Equation 20>}$$
$$= R' = 4$$

Figure 6:
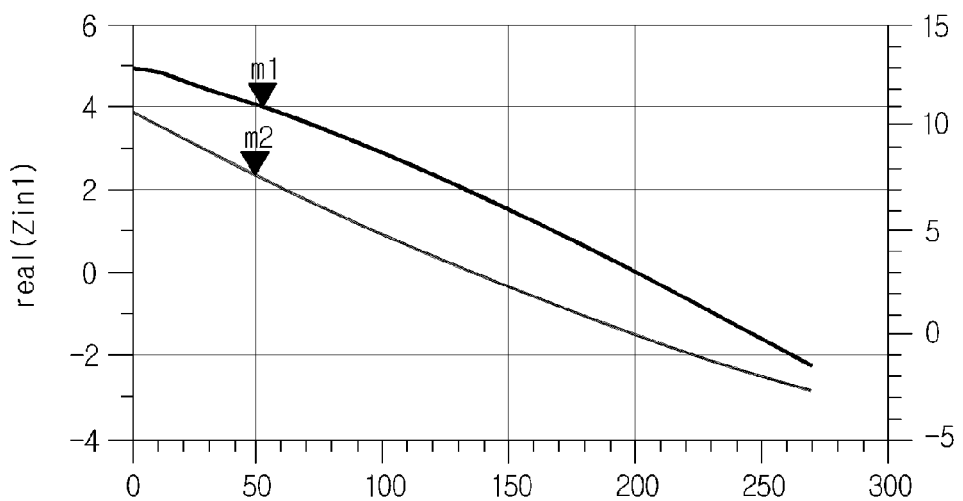
FIG. 6 is a graph depicting simulation results of $I_1$ vs. $Z_{2\_LOAD\_f2}$.

FIG. 6 is a graph depicting simulation results of $I_1$ vs. $Z_{2\_LOAD\_f2}$, when the transmission line 40 has a characteristic impedance $Z_T=7\Omega$ and an electrical length $\theta=135$. In FIG. 6, an upper curve indicates a real number part of $Z_{2\_LOAD\_f2}$ and a lower curve indicates an imaginary number part of $Z_{2\_LOAD\_f2}$.

In FIG. 6, m1 indicates that the real number part of $Z_{2\_LOAD\_f2}$ becomes R'=4Ω. At m1, the electric current $I_1$ is about 52 mA and the imaginary number part of $Z_{2\_LOAD\_f2}$ is about j7.6. Thus, when the switch 50 is turned off at the frequency $f_1$=1950 MHz, the amplifier operates at $Z_{2\_LOAD\_f1}$=4Ω at the frequency $f_1$=1950 MHz, and when the switch is turned on and the electric current $I_1$ is set to 52 mA at a frequency $f_2$=835 MHz, the amplifier operates at $Z_{2\_LOAD\_f2}$=4+j7.6Ω at the frequency $f_2$=835 MHz. With such configuration, the multi-band power amplifier may operate on the same load line at the frequency $f_1$=1950 MHz (in OFF state) and at the frequency $f_2$=835 MHz (in ON state) according to on/off of the switch 50.

Figure 7:
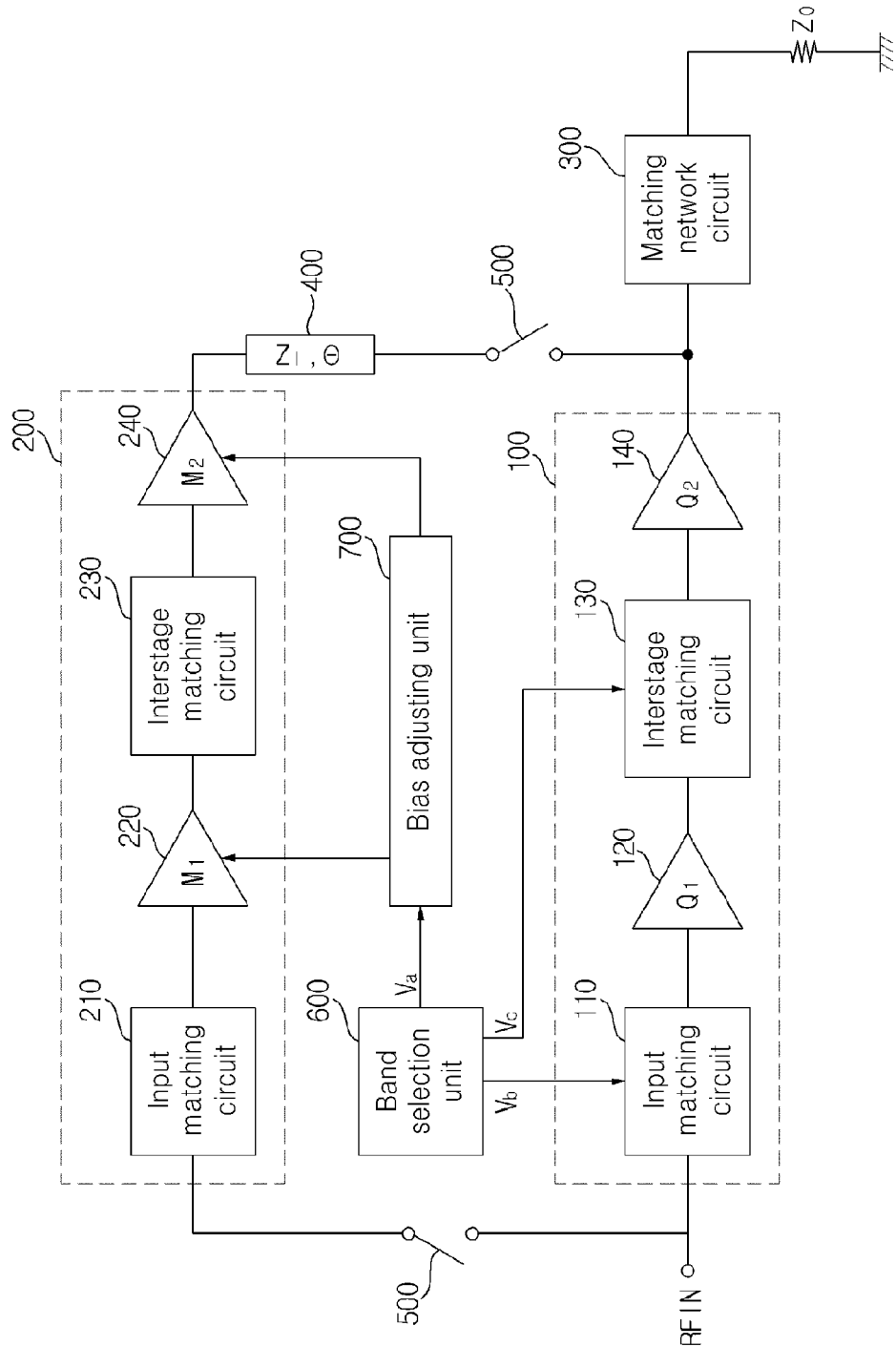
FIG. 7 is a circuit diagram of a multi-band power amplifier according to another embodiment of the present invention.

FIG. 7 is a circuit diagram of a multi-band power amplifier according to another embodiment of the present invention.

The multi-band power amplifier according to this embodiment includes a power amplification unit 100 which amplifies an input signal, a matching network circuit 300 which provides impedance matching between the power amplification unit 100 and a load $Z_0$, an auxiliary amplification unit 200 which additionally supplies a certain magnitude of electric current to the load $Z_0$, a transmission line 400 which changes the magnitude and phase of electric current output from the auxiliary amplification unit 200, a switch 500 which interrupts the electric current additionally supplied to the load $Z_0$, a band selection unit 600 which selects an operating frequency band of the multi-band power amplifier, and a bias adjusting unit 700 which determines the magnitude of electric current output from the auxiliary amplification unit 200 by adjusting a bias of the auxiliary amplification unit 200 according to the frequency band selected by the band selection unit 600.

The switch 500 becomes an ON state in order to allow the multi-band power amplifier to operate at an original operating frequency band of the power amplification unit 100 and becomes an OFF state to allow the multi-band power amplifier to operate at other operating frequency bands.

The power amplification unit 100 is embodied by a two-stage amplification circuit including a first amplifier 120 and a second amplifier 140, and thus includes an input matching circuit 110, which provides impedance matching between an inlet stage thereof and the first amplifier 120, and an interstage matching circuit 130, which provides impedance matching between the first amplifier 120 and the second amplifier 140. Although the power amplification unit 100 is illustrated as being a two-stage amplification circuit in this embodiment, it should be understood that the present invention is not limited thereto and the power amplification unit according to the present invention may be realized by any multi-stage amplification circuit.

The auxiliary amplification unit 200 is embodied by a two-stage amplification circuit including a first amplifier 220 and a second amplifier 240, and includes an input matching circuit 210, which provides impedance matching between an inlet stage thereof and the first amplifier 220, and an interstage matching circuit 330, which provides impedance matching between the first amplifier 220 and the second amplifier 240. The auxiliary amplification unit 200 may also be realized by any multi-stage amplification circuit.

The band selection unit 600 selects an operating frequency band in response to a user command or external command, and generates control signals corresponding to the selected frequency band. As shown in the drawings, the control signals include a control signal $V_a$ to the bias adjusting unit 700 and control signals $V_b$, $V_c$ to the power amplification unit 100. When the number of operating frequency bands is N, the band selection unit 600 may require M (N<2M) control bits in order to generate control signals corresponding to the operating frequency bands.

The control signal $V_a$ applied to the bias adjusting unit 700 controls the bias adjusting unit 700 to adjust the bias of the auxiliary amplification unit 200 according to the frequency band. Specifically, the bias adjusting unit 700 adjusts biases of the first and second amplifiers 220, 240 of the auxiliary amplification unit 200 in response to the control signal so as to allow the auxiliary amplification unit 200 to output a predetermined magnitude of electric current. The magnitudes of electric current output from the auxiliary amplification unit 200 according to the frequency bands are set such that impedances seen from an output stage of the power amplification unit 100 towards the load are the same in the respective frequency bands.

The control signals $V_b$, $V_c$ applied to the power amplification unit 100 adjust impedances of the input matching circuit 110 and the interstage matching circuit 130, which constitutes the impedance matching circuit of the power amplification unit 100.

Figure 7A:
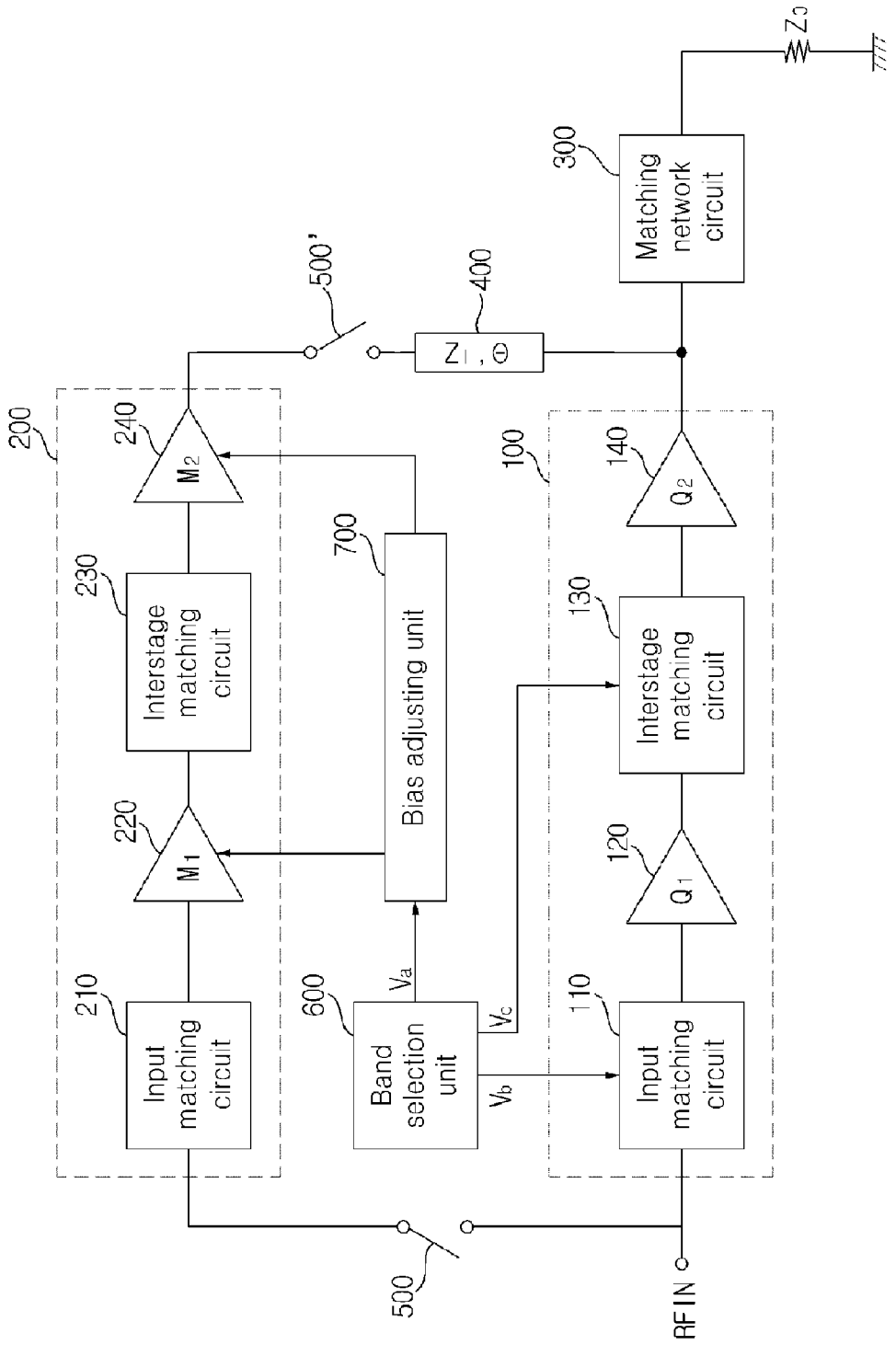
FIG. 7A is a circuit diagram of a multi-band power amplifier, similar to that of FIG. 7, but in which a switch is placed between the auxiliary amplification unit and the transmission line.

Alternatively, as shown in FIG. 7A, it is possible to provide the multi-band power amplifier in which a switch 500' is placed between the auxiliary amplification unit and the transmission line. Such an amplifier would otherwise function as described above in connection with FIG. 7.

Figure 8:
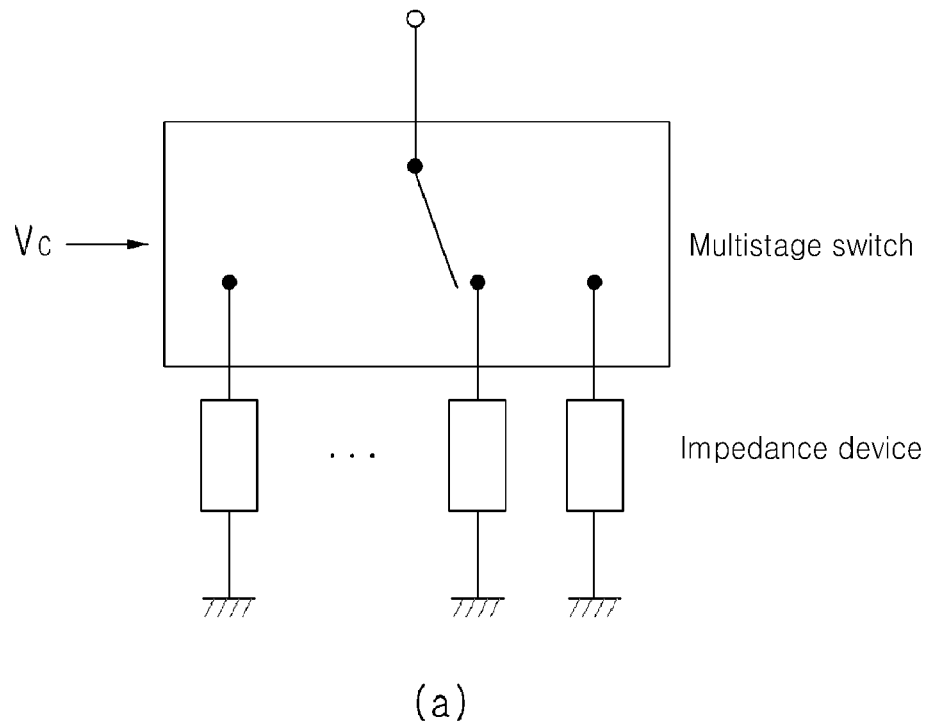
FIG. 8 shows an input matching circuit 110 and an inter-stage matching circuit 130 according to one embodiment of the present invention.
Figure 8:
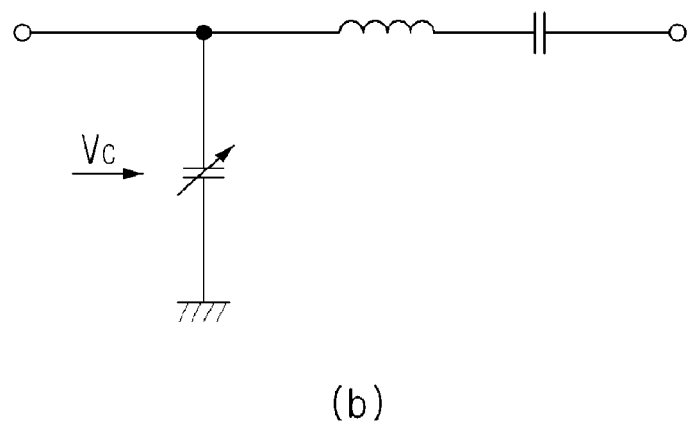

As shown in FIG. 8(a), the input matching circuit 110 and the interstage matching circuit 130 may be constituted by a multistage switch and different impedance devices connected to the respective stages of the multistage switch to allow the control signal to control the multistage switch in order to adjust the impedances thereof. Alternatively, the input matching circuit 110 and the interstage matching circuit 130 may be constituted by a variable capacitor to allow the control signal to adjust capacitance of the variable capacitor in order to adjust the impedances thereof, as shown in FIG. 8(b).

According to this embodiment, the biases of the amplifiers in the auxiliary amplification unit 200 are adjusted according to the frequency bands, and the impedances of the impedance matching circuits of the power amplification unit 100 are adjusted according to the frequency band, thereby allowing the multi-band power amplifier to operate at a plurality of predetermined frequency bands.

According to the present invention, the multi-band power amplifier may include a power amplification unit for amplifying an input signal and an auxiliary amplification unit for additionally supplying electric current to a load in order to achieve operation at various frequency bands. Therefore, output impedance may be adjusted using a small amount of electric current from the auxiliary amplification unit and multi-band performance may be realized by a single power amplification unit and an impedance matching circuit at an output stage, thereby enabling reduction in circuit area.

Some exemplary embodiments have been described above. It will be understood by those skilled in the art that various modifications, variations and alterations can be made without departing from the spirit and scope of the present invention. Therefore, these embodiments should not be construed as limiting the present invention, but should be construed as illustrating the invention. The scope of the present invention should be interpreted according to the following appended claims as covering all modifications or variations derived from the appended claims and equivalents thereof.

The invention claimed is:

1. A multi-band power amplifier comprising:
a power amplification unit which amplifies an input signal; a matching network circuit which provides impedance matching between the power amplification unit and a load; an auxiliary amplification unit which additionally supplies a certain magnitude of electric current to the load; a transmission line which changes the magnitude and phase of electric current output from the auxiliary amplification unit, while maintaining impedances seen from the power amplification unit towards the load are the same at a first frequency and at a second frequency; and a switch which interrupts the electric current additionally supplied to the load, set to an OFF state and an ON state in accordance with a current condition, said switch directly connected between the transmission line and an output of the power amplification unit; wherein the electric current output from the auxiliary amplification unit is set according to a bias circuit of the auxiliary amplification unit.

2. The multi-band power amplifier according to claim 1, wherein the switch is set to an OFF state at a first frequency and to an ON state at a second frequency.

3. The multi-band power amplifier according to claim 1, wherein the electric current output from the auxiliary amplification unit is set such that the impedances seen from the power amplification unit towards the load are the same at the first frequency and at the second frequency.

4. A multi-band power amplifier comprising:
a power amplification unit which amplifies an input signal; a matching network circuit which provides impedance matching between the power amplification unit and a load; an auxiliary amplification unit which additionally supplies a certain magnitude of electric current to the load; a transmission line which changes the magnitude and phase of electric current output from the auxiliary amplification unit; and a switch, directly connected between the transmission line and an output of the power amplification unit, and placed in series with the auxiliary amplification unit and the transmission line, which interrupts the electric current additionally supplied to the load.

5. The multi-band power amplifier according to claim 4, wherein the switch is placed between the transmission line and an output stage of the power amplification unit.

6. A multi-band power amplifier comprising:
a power amplification unit which amplifies an input signal;
a matching network circuit which provides impedance matching between the power amplification unit and a load;
an auxiliary amplification unit which additionally supplies a certain magnitude of electric current to the load;
a band selection unit which selects an operating frequency band of the multi-band power amplifier;
a bias adjusting unit which adjusts the magnitude of electric current output from the auxiliary amplification unit according to the frequency band selected by the band selection unit; and
an impedance matching circuit, wherein the band selection unit generates a control signal to adjust an impedance of the impedance matching circuit according to the selected frequency band.

7. The multi-band power amplifier according to claim 6, further comprising:
a transmission line which changes the magnitude and phase of electric current output from the auxiliary amplification unit.

8. The multi-band power amplifier according to claim 6, wherein the bias adjusting unit adjusts the magnitude of electric current output from the auxiliary amplification unit by adjusting a bias of the auxiliary amplification unit.

9. The multi-band power amplifier according to claim 6, further comprising:
a switch which interrupts the electric current additionally supplied to the load.

10. The multi-band power amplifier according to claim 6, wherein the band selection unit generates a control signal to control the bias adjusting unit to adjust the magnitude of electric current output from the auxiliary amplification unit by adjusting a bias of the auxiliary amplification unit according to the selected frequency band.

11. The multi-band power amplifier according to claim 6, wherein the impedance matching circuit comprises a multi-stage switch and different impedance devices connected to respective stages of the multistage switch, and the control signal adjusts the impedance of the impedance matching circuit by controlling the multistage switch.

12. The multi-band power amplifier according to claim 6, wherein the impedance matching circuit comprises a variable capacitor and the control signal adjusts the impedance of the impedance matching circuit by controlling capacitance of the variable capacitor.

* * * * *